United States Patent [19]
Glatts, III

[11] Patent Number: 6,019,610
[45] Date of Patent: Feb. 1, 2000

[54] ELASTOMERIC CONNECTOR

[76] Inventor: George F. Glatts, III, 2009 Carmel Dr., Jamison, Pa. 18929

[21] Appl. No.: 09/197,885

[22] Filed: Nov. 23, 1998

[51] Int. Cl.[7] ...................................................... H01R 9/09
[52] U.S. Cl. ................................................................ 439/66
[58] Field of Search .............................. 439/66, 91, 591, 439/733.1, 515, 81, 71

[56] References Cited

U.S. PATENT DOCUMENTS

| | | | |
|---|---|---|---|
| 4,408,814 | 10/1983 | Takashi et al. | 339/59 |
| 4,520,562 | 6/1985 | Sado et al. | 29/878 |
| 4,998,885 | 3/1991 | Beaman | 439/66 |
| 5,101,553 | 4/1992 | Carey et al. | 29/882 |
| 5,417,577 | 5/1995 | Holliday et al. | 439/91 |
| 5,427,535 | 6/1995 | Sinclair | 439/66 |
| 5,529,504 | 6/1996 | Greenstein et al. | 439/91 |
| 5,540,594 | 7/1996 | Collins et al. | 439/66 |
| 5,618,189 | 4/1997 | Jin et al. | 439/91 |
| 5,636,996 | 6/1997 | Johnson et al. | 439/66 |
| 5,733,640 | 3/1998 | Horiuchi et al. | 428/210 |
| 5,860,818 | 1/1999 | Sakaki et al. | 439/91 |

*Primary Examiner*—Khiem Nguyen
*Assistant Examiner*—Michael C. Zarroli
*Attorney, Agent, or Firm*—LaMorte & Associates

[57] ABSTRACT

The present invention is an elastomeric connector and the associated method used to manufacture the elastomeric connector. The elastomeric connector includes a segment of a dielectric substrate having a top surface and a bottom surface. A plurality of conductive elements are positioned within the dielectric substrate in a predetermined pattern. Portions of the conductive elements lay exposed on the top surface and the bottom surface of the dielectric substrate within the selected pattern. Accordingly, any contacts that abut against the top surface and the bottom surface of the elastomeric connector will be electrically interconnected by the conductive wire. Each of the conductive elements is configured in a manner that prevents the dielectric substrate from enveloping the conductive elements at the points where they enter the dielectric substrate. Accordingly, as the dielectric substrate is repeatedly compressed, the conductive elements resist becoming buried within the material of the dielectric substrate.

15 Claims, 9 Drawing Sheets

ELASTOMERIC CONNECTOR

BACKGROUND OF THE INVENTION

1. Field of the Invention

The present invention relates to elastomeric connectors that are used to electrically interconnect contact areas on opposing surfaces by compressing the elastomeric connectors between the opposing surfaces. More specifically, the present invention relates to the structure of elastomeric connectors and the methods used to manufacture elastomeric connectors.

2. Prior Art Statement

As electronic circuitry becomes smaller and more densely populated with components, it is often difficult to interconnect separate electronic circuits using traditional soldering techniques. The difficulty of using solder is particularly evident when contact areas on opposing circuit boards must be joined. In the prior art, land grid arrays were commonly placed between opposing contact areas. The land grid arrays were then soldered in place to both contact areas. However, due to many variables, such as temperature stress, plating variations, substrate warpage and the like, such soldered connections often proved unreliable.

In an attempt to improve the reliability of connections between opposing contact surfaces, elastomeric connectors have been developed. Elastomeric connectors contain conductive elements that are suspended in an elastomeric substrate. The conductive elements are exposed on the top surface and bottom surface of the elastomeric substrate. When the elastomeric connector is placed between opposing contact points, the contact points contact the conductive elements that are contained within the elastomeric connector, thereby creating an electrical interconnection. The elastomeric material suspending the conductive elements allows the conductive elements to expand and contract as needed in between the opposing contact points without disrupting the electrical interconnection.

In the prior art, elastomeric connectors typically are manufactured by molding elastomeric material around conductive elements. The molded assembly is then often sliced into segments to expose the edges of the conductive elements within the elastomeric material. Such prior art elastomeric connectors are exemplified by U.S. Pat. No. 5,101,553 to Carey, entitled Method Of Making A Metal-On-Elastomer Pressure Contact Connector; and U.S. Pat. No. 4,520,562 to Sado, entitled Method For Manufacturing An Elastic Composite Body With Metal Wires Embedded Therein.

A problem associated with such prior art elastomeric connectors is that they are difficult and expensive to manufacture. The molding of elastomeric material around a dense grouping of conductive wires requires precise molding techniques, expensive molds and exacting premolding set-up tolerances. Furthermore, due to the pressures experienced during molding, ultra thin conductive wires typically are not used because the thin wires can move out of place or break during the molding procedure. Accordingly, using prior art manufacturing techniques, it is very difficult to produce an elastomeric connector with very thin conductive elements that embody a low impedance, a low inductance and a low surface resistance. Such characteristics, however, are required for many types of circuits. Accordingly, elastomeric connectors are not preferred in certain types of circuit designs.

The difficulty in molding elastomeric connectors also limits the shapes into which the elastomeric connectors can be molded. Typically, the shape capable of being produced in the prior art is a generally planar elastomeric connector having a flat top surface and a flat bottom surface. Accordingly, elastomeric connectors are typically not selected in a situation where unusually oriented contact points must be interconnected.

Another problem associated with prior art elastomeric connectors is when the elastomeric connector is compressed and released, the elastomeric material may expand to a degree greater than that of the conductive wires contained within the elastomeric material. As a result, the conductive wires become buried within the elastomeric material. Accordingly, when the elastomeric connector is again compressed, the elastomeric material may shield some of the conductive wires and make the elastomeric connector less conductive.

A need therefore exists in the prior art for an improved elastomeric connector that embodies both a low impedance and a low inductance. The need also exists for an elastomeric connector that can be configured in unusual shapes and can be repeatedly compressed without loss of conductivity due to buried conductive elements.

These needs are met by the present invention as described and claimed below.

SUMMARY OF THE INVENTION

The present invention is an improved elastomeric connector and the associated method used to manufacture the elastomeric connector. The elastomeric connector includes a segment of a dielectric substrate having a top surface and a bottom surface. A plurality of conductive elements are positioned within the dielectric substrate in a predetermined pattern. Portions of the conductive elements lay exposed on the top surface and the bottom surface of the dielectric substrate within the selected pattern. Accordingly, any contacts that abut against the top surface and the bottom surface of the elastomeric connector will be electrically interconnected by the conductive elements. Each of the conductive elements is configured in a manner that prevents the dielectric substrate from enveloping the conductive elements at the points where they enter the dielectric substrate. Accordingly, as the dielectric substrate is repeatedly compressed, the conductive elements resist becoming buried within the material of the dielectric substrate.

The material of the conductive elements, size of the conductive elements and pattern for the conductive elements can be selectively altered to match the elastomeric connector to a desired impedance value. Furthermore, the pattern of the conductive elements can be custom designed for a given application, thereby producing a perfectly matched elastomeric connector for a given application.

BRIEF DESCRIPTION OF THE DRAWINGS

For a better understanding of the present invention, reference is made to the following description of exemplary embodiments thereof, considered in conjunction with the accompanying drawings, in which.

DETAILED DESCRIPTION OF THE INVENTION

Figure 2:
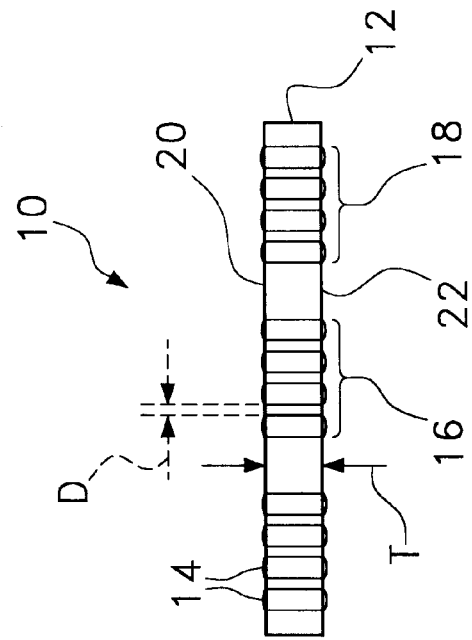
FIG. 2 is a cross-sectional view of the embodiment of the elastomeric connector shown in FIG. 1, viewed along section line 2—2.
Figure 1:
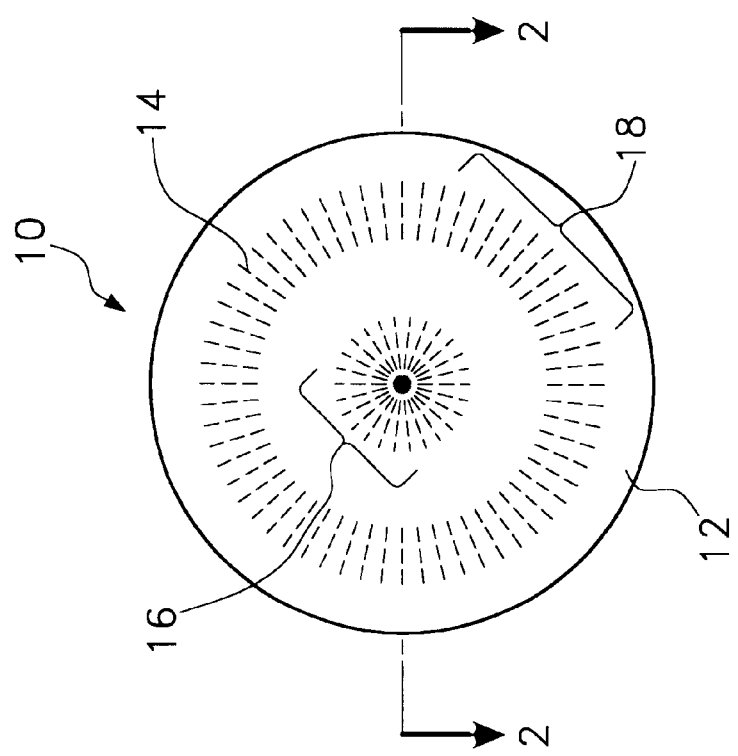
FIG. 1 is a top view of an exemplary embodiment of an elastomeric connector in accordance with the present invention.

Referring to FIG. 1 and FIG. 2, in combination, an exemplary embodiment of an elastomeric connector 10 is shown in accordance with the present invention. In the shown embodiment, a dielectric substrate 12 is shown. The dielectric substrate 12 is shaped as a circular disk. As will later be explained, the shown shape of the dielectric substrate 12 is merely exemplary and any shape or configuration can be used within the teachings of the present invention.

The dielectric substrate 12 can be any dielectric material that embodies elastomeric properties. Suitable materials include, but are not limited to, solid silicones, silicone foams, synthetic rubbers, triblock copolymers and styrene polymers. The thickness T (FIG. 2) of the dielectric substrate 12 can be any desired thickness. However, in most applications the thickness T of the dielectric substrate will be between 0.005 inches to 0.250 inches.

Conductive wire 14 is sewn through the dielectric substrate 12 in a desired pattern. In the shown embodiment, conductive wire 14 is sewn in a bull's eye pattern that makes the elastomeric connector 10 suitable for use in a coaxial connection. In the shown embodiment, the conductive wire 14 is sewn in a radial pattern in the center region 16 of the dielectric substrate 12 and around the peripheral region 18 of the dielectric substrate 12. The use of a coaxial pattern was selected as the exemplary embodiment to illustrate that the conductive wire 14 can be sewn into any desired pattern on the dielectric substrate 12 and the conductive wire 14 need not be evenly distributed across the entire dielectric substrate 12.

Referring solely to FIG. 2, it can be seen that the conductive wire 14 is sewn through the material of the dielectric substrate 12. The conductive wire 14 passes vertically through the material of the dielectric substrate 12 and is advanced along the top surface 20 and bottom surface 22 of the dielectric substrate 12, in a standard sewing stitch pattern. As the conductive wire 14 is advanced along the top surface 20 and bottom surface 22 of the dielectric substrate 12, the conductive wire 14 lays exposed on the top surface 20 and bottom surface 22 of the dielectric substrate 12. Accordingly, any object that were to press against the top surface 20 or the bottom surface 22 of the dielectric substrate 12 would contact the conductive wire 14.

The conductive wire 14 can be any wire capable of conducting electricity. The width of the conductive wire 14 and the density at the sewn pattern of wire can be selectively altered as desired. Accordingly, the inductance value and impedance value embodied by the elastomeric connector 10 can be selectively altered to match the needed impedance values and inductance values of a particular circuit.

The thickness of the conductive wire 14 can be as narrow as 0.0005 inches. Although the conductive wire 14 can be any gauge greater than 0.0005 inches, in most applications the thickness of the wire 14 will be below 0.10 inches.

As the conductive wire 14 is advanced along the top surface 20 and the bottom surface 22 of the dielectric substrate 12, a distance D is created between vertical runs of the conductive wire 14. The distance D, between vertical runs of the conductive wire 14, is herein referred to as the sewn pattern pitch. The sewn pattern pitch can be any distance greater than twice the thickness of the conductive wire 14 being used.

In FIG. 2, it can be seen that the sewn pattern pitch of the conductive wire 14 in the center region 16 of the elastomeric connector 10 is different than the sewn pattern pitch of the conductive wire 14 in the peripheral region 18 of the elastomeric connector 10. Accordingly, it should be understood that the density of the conductive wire 14 can vary at different points on the elastomeric connector 10. The impedance value and inductance value of the elastomeric connector 10 can therefore be varied at different points, if desired.

Figure 3:
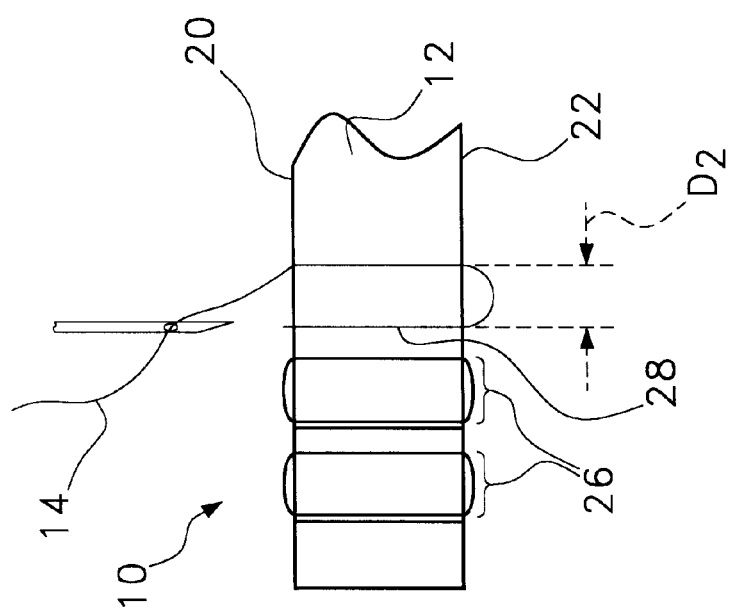
FIG. 3 is a method flow schematic illustrating method steps in an exemplary method of manufacture for the elastomeric connector.

Referring to FIG. 3, a preferred stitching pattern is shown for the conductive wire 14. In the embodiment of FIG. 3, individual conductive areas 26 are produced by the sewn conductive wire 14. Each of the individual conductive areas 26 is electrically isolated from each of the other conductive areas. In the shown embodiment, each conductive area 26 is made by an initial vertical stitch 28 that brings the conductive wire 14 from the top surface 20 of the dielectric substrate 12 to the bottom surface 22 of the dielectric substrate 12. Once at the bottom surface 22 of the dielectric substrate 22, the conductive wire 14 is advanced laterally a distance D2. The conductive wire 14 is then pulled vertically back through the dielectric substrate 12 to the top surface 20 of the dielectric substrate 12. At this point, the conductive wire 14 is then moved back laterally close to its point of origin. The conductive wire 14 is then again advanced vertically down into the dielectric substrate 12, thereby completing a looped configuration. Since the conductive wire 14 passes laterally across the top surface 20 of the dielectric substrate 12 and the bottom surface 22 of the dielectric substrate 12, the conductive wire 14 resists being pressed into the elastomeric material of the substrate 12 as the substrate 12 is repeatedly compressed. Accordingly, the conductivity of the elastomeric connector 10 does not degrade over time.

Figure 4:
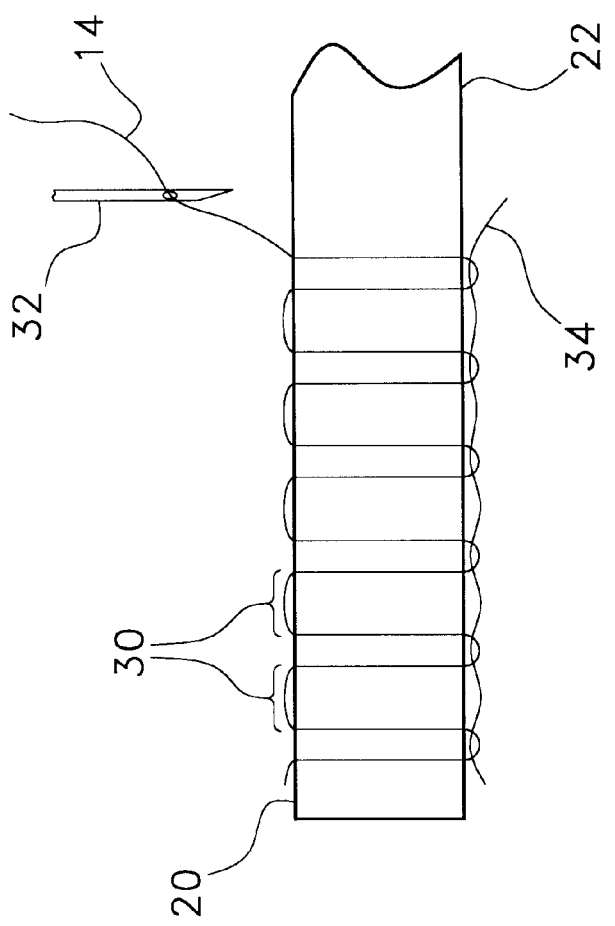
FIG. 4 is a cross-sectioned perspective view of an alternate embodiment of an elastomeric connector in accordance with the present invention.

Referring to FIG. 4, an alternate sewing pattern is shown for the conductive wire 14. In this embodiment, a single continuous conductive wire 14 is used across multiple conductive regions 30. To produce the shown sewing pattern, a primary conductive wire 14 is plunged vertically into the dielectric substrate 12 with a sewing needle 32. Once at the bottom surface 22 of the dielectric substrate 12, the primary conductive wire 14 intersects a secondary conductive wire 34. Once looped, the primary conductive wire 14 is pulled vertically back to the top surface 20 of the dielectric substrate 12. The conductive wire 14 is advanced laterally across the top surface 20 of the dielectric substrate 12 and the process is repeated.

The presence of the secondary conductive wire 34 along the bottom surface 22 of the dielectric substrate prevents the primary conductive wire 14 from retracting into the elastomeric material of the substrate 12 from the bottom surface 22. Similarly, the lateral crossing of the primary conductive wire 14 along the top surface 20 of the dielectric substrate 12 prevents the primary conductive wire 14 from retracting into the dielectric material of the substrate 12 from the top surface 20.

It will be understood that the stitch patterns shown in FIG. 3 and FIG. 4 are merely exemplary. In automated sewing there are numerous stitches that can be produced. Any such stitch pattern can be adapted for use with the present invention.

Figure 5:
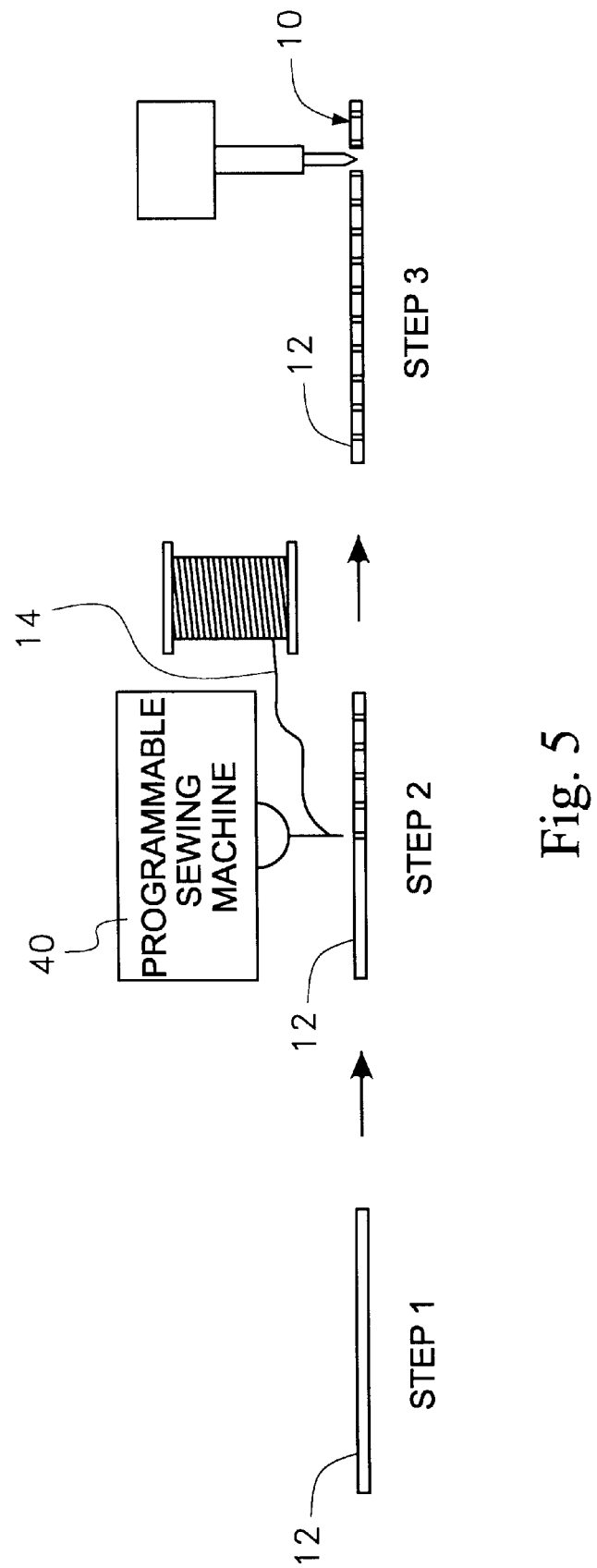
FIG. 5 is a cross-sectional view of another alternate embodiment of an elastomeric connector in accordance with the present invention.

Referring to FIG. 5, an exemplary method of manufacture is illustrated. In order to manufacture an elastomeric connector 10 in accordance with the present invention, a sheet of the dielectric substrate 12 is first provided. (See step 1.) The sheet of the dielectric substrate 12 is then placed in a programmable sewing machine 40 that is threaded with the conductive wire 14 to be used in the elastomeric connector 10. (See step 2.) A desired pattern is programmed into the programmable sewing machine 40. The desired pattern contains the selected sewn pattern pitch of the conductive wire 14 in all areas of the elastomeric connector.

The programmable sewing machine 40 sews the conductive wire 14 in the pattern selected. After the selected pattern is sewn, the elastomeric connector 10 is cut from the dielectric substrate 12. (See step 3.) Since the conductive wire 14 is sewn into a predetermined pattern, the elastomeric connector 10 does not need to be cut to exacting tolerances. Any portion of the elastomeric connector 10 that is not contained within the sewn pattern is dielectric and is incapable of creating electrical shorting. The cut edges of the elastomeric connector 10 are dielectric, thereby not allowing for any on-edge shorting with electrical components.

The method of manufacture illustrated by FIG. 5 can be altered slightly. Instead of sewing the conductive wire 14 into the dielectric substrate 12 before the dielectric substrate 12 is cut, the dielectric substrate 12 can be initially cut into appropriately sized pieces. The conductive wire 14 can then be sewn into the cut pieces of substrate 12 in a secondary procedure.

Figure 6:
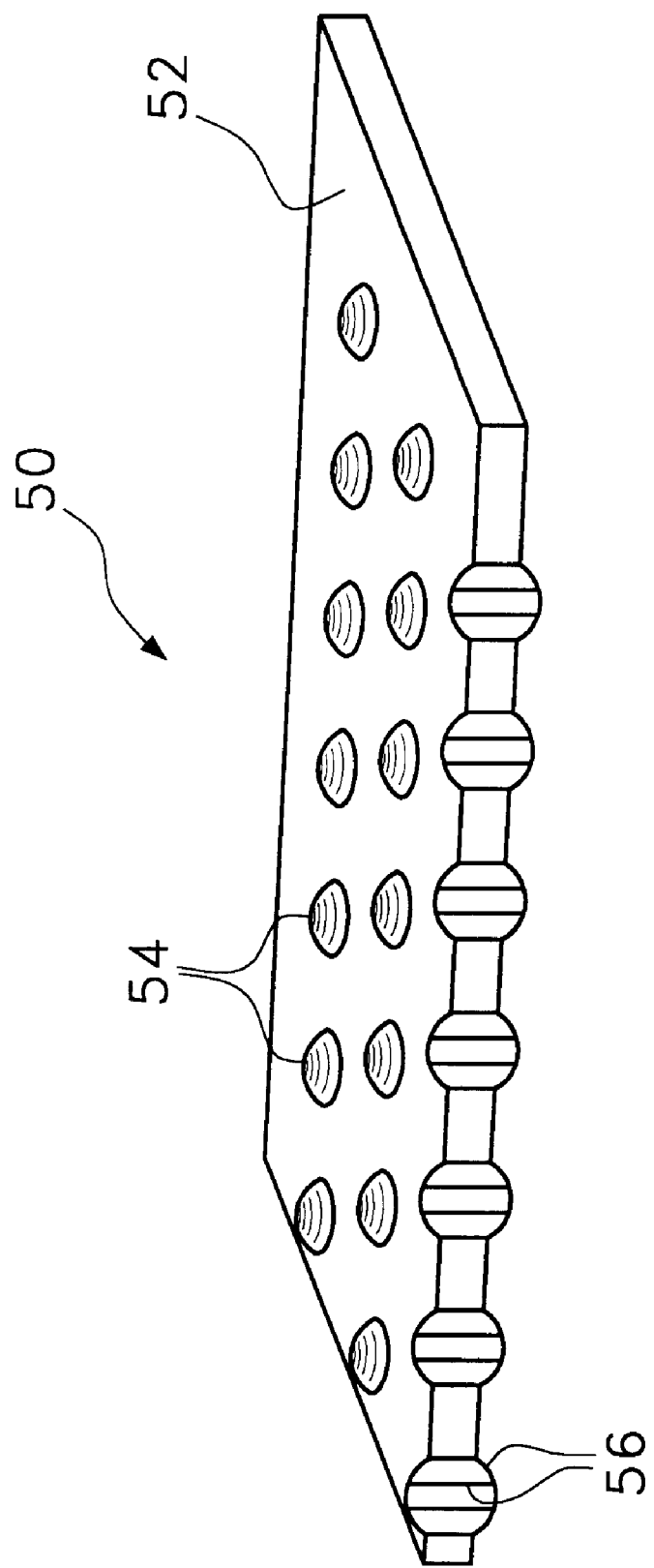
FIG. 6 is a cross-sectional view of yet another alternate embodiment of an elastomeric connector in accordance with the present invention.

Referring to FIG. 6, an alternate embodiment of an elastomeric connector 50 is shown. In this embodiment, a dielectric substrate 52 is provided that contains protrusion 54 on one or both sides of the substrate 52. Using the manufacturing technique of the present invention, a conductive wire 56 can be sewn through the elastomeric substrate 52 in the areas corresponding to the area of the protrusions 54. Accordingly, any object that rests upon the protrusions 54 of the elastomeric connector 50 would contact the conductive wire 56. The use of protrusions 54 on the elastomeric connector 50 greatly reduces the compression pressures needed to create contact between the elastomeric connector 50 and another electrical component.

Figure 7:
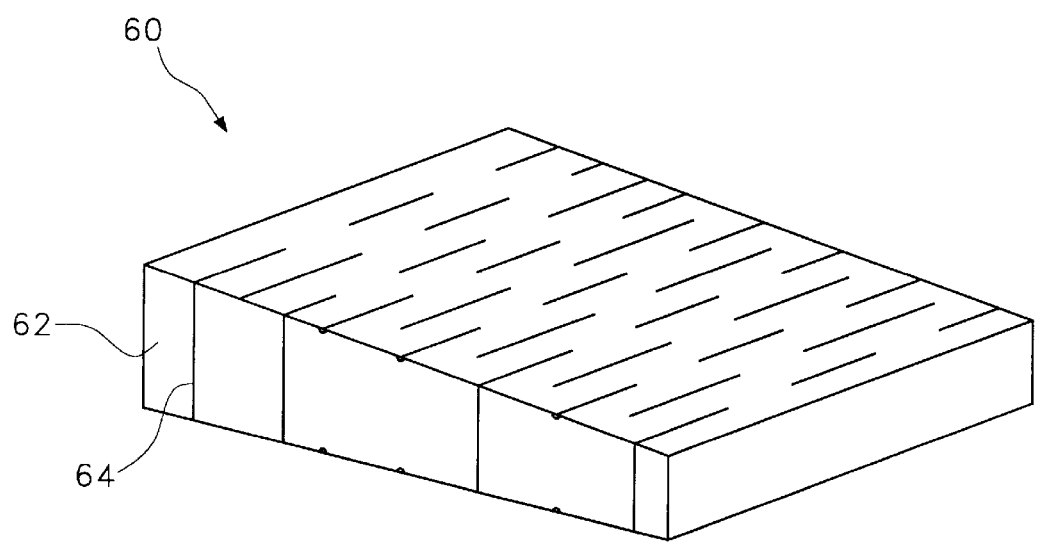
FIG. 7 is a perspective view of an alternated embodiment of an elastomeric connector in accordance with the present invention.

Referring to FIG. 7, another alternate embodiment of an elastomeric connector 60 is shown. In this embodiment, the dielectric substrate 62 is not flat. Rather, the dielectric substrate 62 is tapered from a thick edge to a thin edge. The purpose of FIG. 7 is to illustrate that a conductive wire 64 can be sewn through many different configurations of a dielectric substrate 62. Accordingly, custom shape dielectric substrates 62 can be developed for different needs. The shown wedge shaped elastomeric connector 60 may be useful in joining opposing circuit boards that do not lay in parallel planes.

Figure 8:
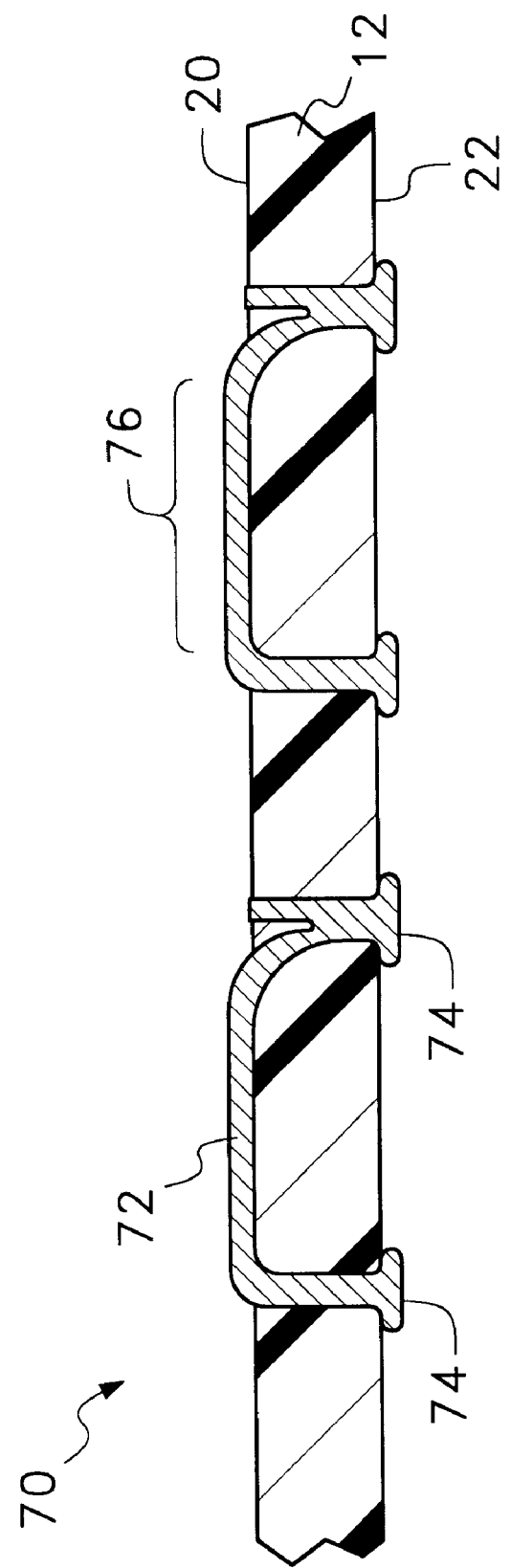
FIG. 8 is a cross-sectional view of an alternate embodiment of an elastomeric connector in accordance with the present invention.

Referring to FIG. 8, a segment of another elastomeric connector 70 is shown. The elastomeric connector 70 is fabricated from a conductive wire 72 being passed through a dielectric substrate 12. However, in the shown embodiment, the conductive wire 72 is passed through the dielectric substrate 12 using a ball bonding technique. As a result of the ball bonding technique, the conductive wire 72 passes vertically from the top surface 20 of the substrate 12 to the bottom surface 22 of the substrate 12 at two points. The conductive wire 72 terminates with an enlarged head 74 at the two points on the bottom surface 22 of the substrate 12. The enlarged heads 74 prevent the ends of the conductive wire 72 from retracting into the elastomeric material of the substrate 12 when compressed. Similarly, the lateral leg 76 of the conductive wire 72 that runs across the top surface 20 of the dielectric substrate 12 prevents the conductive wire 72 from passing into the top of the elastomeric material of the dielectric substrate 12.

Figure 9:
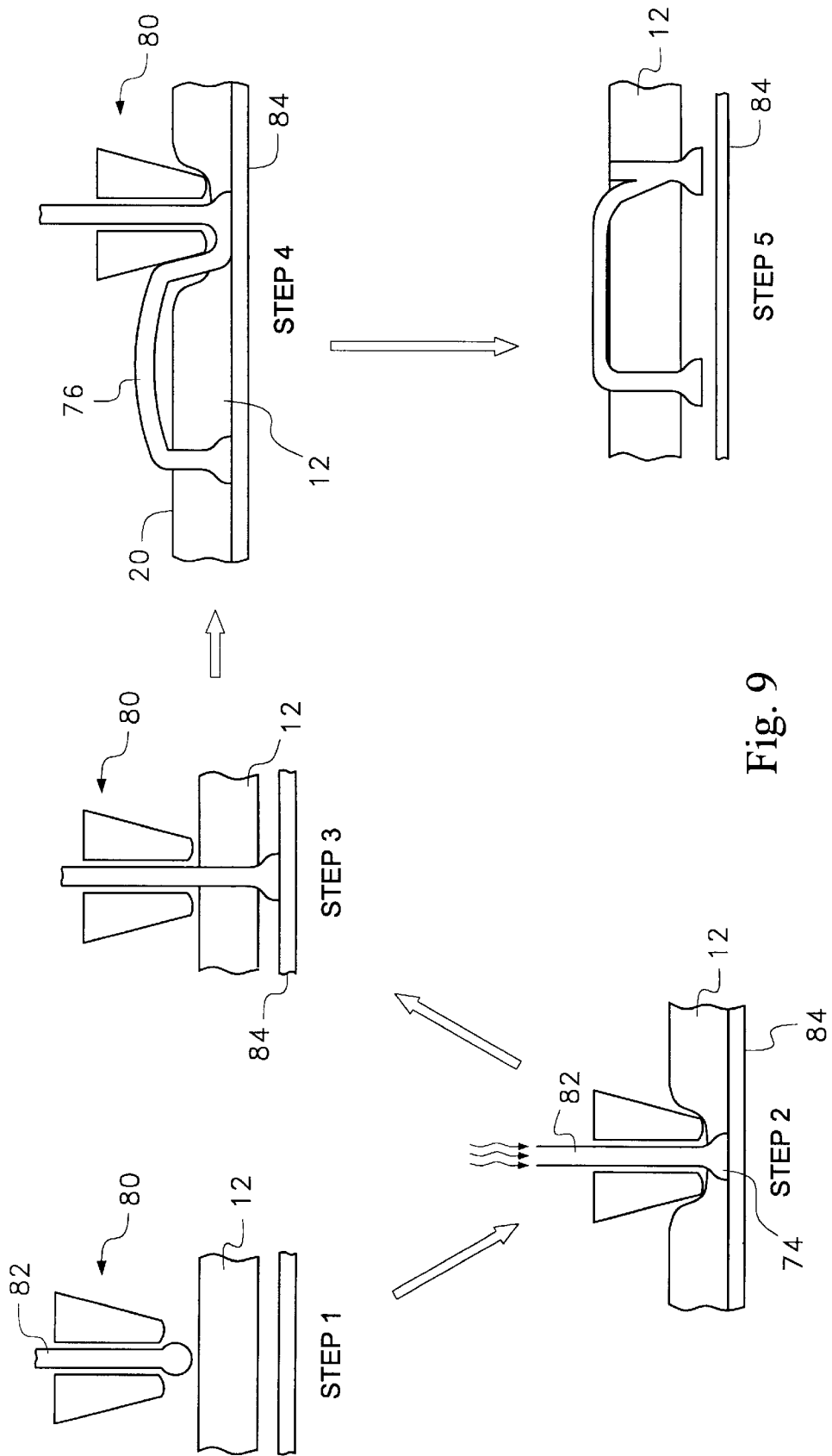
FIG. 9 is an illustration of the method steps used to create the embodiment of the present invention shown in FIG. 8.

Referring to FIG. 9, the method of forming the present invention using a ball bonding technique is shown. As shown in step 1, an dielectric substrate 12 of elastomeric material is placed into a ball bonding machine 80 that is loaded with a length of conductive wire 82. In step 2, it can be seen that the conductive wire 82 is plunged through the elastomeric material of the dielectric substrate 12, wherein the conductive wire 82 contacts a bond pad 84 positioned below the dielectric substrate 12. As the conductive wire 82 contacts the bond pad 84, ultrasonic energy is directed through the conductive wire 82. The ultrasonic wire causes the conductive wire 82 to soften and form the enlarged head feature 74 at the end of the conductive wire 84. From step 3, it is seen that as the tip of the ball bonding machine 80 moves away, the newly formed enlarged head 74 remained affixed to the bond pad 84 and the dielectric substrate 12 relaxes back into its original form.

In step 4, it can be seen that the tip of the ball bonding machine 80 moves laterally across the top surface 20 of the dielectric substrate 12. The result is a lateral leg 76 of conductive wire that passes across the top surface 20 of the dielectric substrate 12. After, a lateral run of a predetermined distance, the ball bonding tip again plunges vertically into the elastomeric material of the dielectric substrate 12. A second enlarged head 74 is formed at the bond pad 84 in the same manner as was previously described in step 2. Lastly, the bond pad 84 is removed and a conductive region is formed in the elastomeric connector.

Figure 10:
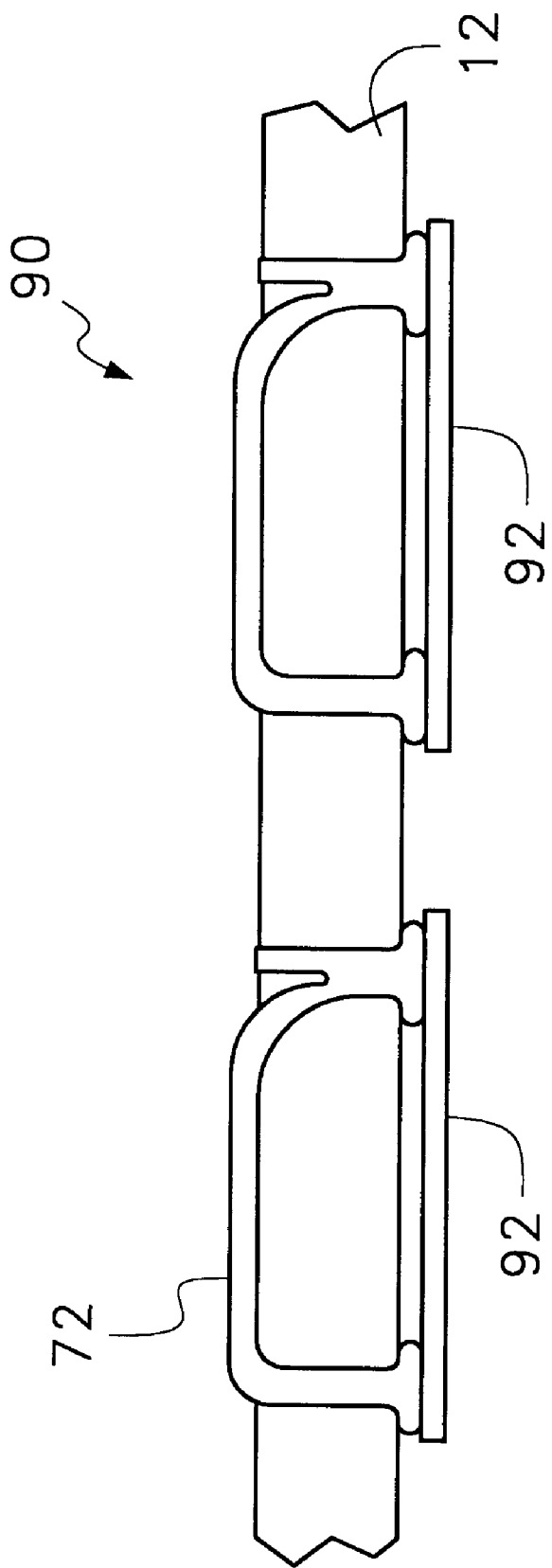
FIG. 10 is a cross-sectional view of an alternate embodiment of an elastomeric connector in accordance with the present invention.

Referring to FIG. 10, an alternate embodiment of a segment of an elastomeric connector 90 is shown that is also formed using a ball bonding technique. However, instead of placing a bond pad below the dielectric substrate, as was done in FIG. 9, individual strips of conductive material 92 are positioned below the dielectric substrate 12.

A conductive wire 72 is bonded to the individual strips of conductive material 92 using the same ball bonding technique previously described. The conductive wire 72 bonds to the individual strip of conductive material 92 at two places, thereby forming a complete loop of conductive material within the dielectric substrate 12. The individual strips of conductive material 92 can be temporarily held in place by a removable ribbon or some other type of support during the ball bonding procedure. Due to the complete loop configuration, the conductive wire 72 cannot easily retract into the elastomeric material of the substrate 12.

Figure 11:
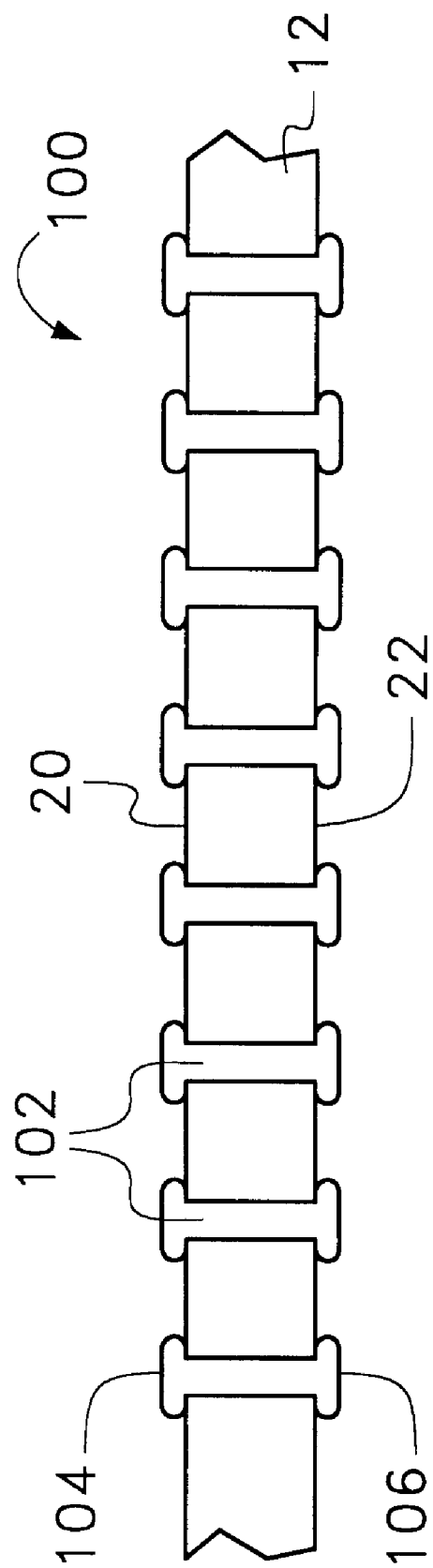
FIG. 11 is a cross-sectional view of a last alternate embodiment of an elastomeric connector in accordance with the present invention.

Referring now to FIG. 11, a segment of yet another embodiment of an elastomeric connector 100 is shown. In this embodiment, individual conductive elements 102 extend through the elastomeric material of the dielectric substrate 12. The individual conductive elements 102 each have an enlarged heads 104 at the top surface 20 of the dielectric substrate 12 and an enlarged head 106 at the bottom surface 22 of the dielectric substrate 12. The enlarged head 104, 106 at the top and bottom of the dielectric substrate 12 prevent the conductive element from easily retracting into the elastomeric material of the substrate 12.

The conductive elements 102 can be molded into the dielectric substrate 12 or can be formed in a secondary procedure. The secondary procedure can be a modified ball bonding technique, a mechanical crimping technique or some combination of both.

It will be understood that the embodiments of the present invention described and illustrated herein are merely exemplary and a person skilled in the art can make many variations to the embodiment shown without departing from the scope of the present invention. For example, many different shaped elastomeric substrates can be used in the present invention other than what has been illustrated. It should also be understood that the various elements from the different embodiments shown can be mixed together to create alternate embodiments that are not specifically described. All such variations, modifications and alternate embodiments are intended to be included within the scope of the present invention as defined by the appended claims.

What is claimed is:

1. An elastomeric connector, comprising:
    a dielectric substrate having a top surface and a bottom surface; and
    a continuous conductive wire extending through said dielectric substrate from said tot surface to said bottom surface at a first point on said dielectric substrate, said conductive wire laterally extending from said first point to a second point along said bottom surface and again extending through said dielectric substrate from said bottom surface to said top surface, wherein portions of said conductive wire lay exposed on said top surface and said bottom surface of said dielectric substrate.

2. The connector according to claim 1, wherein said dielectric substrate is elastomeric.

3. The connector according to claim 1, wherein said top surface and said bottom surface of said dielectric substrate are not parallel.

4. The connector according to claim 15, wherein at least one protrusion extends from said bottom surface of said dielectric substrate and said at least one protrusion, is contained within said predetermined pattern.

5. An elastomeric connector, comprising:
    a dielectric substrate having a top surface and a bottom surface; and
    a plurality of segments of conductive wire, wherein each segment of conductive wire extends through said dielectric substrate from said top surface to said bottom surface at both a first point and at a second point, wherein said first point and said second point are a predetermined distance apart.

6. The connector according to claim 5, wherein said dielectric substrate is elastomeric.

7. The connector according to claim 6, wherein each segment of conductive wire has a first end and an opposite second end, wherein said first end and said second end of each conductive element is exposed on said bottom surface of said dielectric substrate.

8. The connector according to claim 7, wherein both said first end and said second end of said segment of conductive wire terminates with an enlarged head.

9. The connector according to claim 6, wherein each segment of conductive wire has a first end and an opposite second end, wherein said first end and said second end of each segment of conductive wire is coupled to a conductive member that extends along said bottom surface of said dielectric substrate.

10. The connector according to claim 6, wherein said top surface and said bottom surface of said dielectric substrate are not parallel.

11. The connector according to claim 6, wherein each segment of conductive wire is between 0.0005 inches and 0.010 inches thick.

12. The connector according to claim 6, wherein each segment of conductive wire is electrically isolated from segments of conductive wire.

13. The connector according to claim 1, wherein said conductive wire extends laterally along said top surface of said dielectric substrate from said second point back to said first point.

14. The connector according to claim 1, wherein said conductive wire extends through said dielectric substrate at a plurality of points and said conductive wire alternately extends across said top surface and said bottom surface between said plurality of points, wherein said plurality of points are arranges in a predetermined pattern.

15. The connector according to claim 14, wherein at least one protrusion extends from said top surface of said dielectric substrate and said at least one protrusion is contained within said predetermined pattern.

\* \* \* \* \*